United States Patent
Bois et al.

(10) Patent No.: US 10,499,489 B2
(45) Date of Patent: Dec. 3, 2019

(54) DEFECTED GROUND STRUCTURE WITH VOID HAVING RESISTIVE MATERIAL ALONG PERIMETER TO IMPROVE EMI SUPPRESSION

(71) Applicant: Hewlett Packard Enterprise Development LP, Houston, TX (US)

(72) Inventors: Karl J. Bois, Fort Collins, CO (US); Elene Chobanyan, Ft Collins, CO (US); Benjamin Toby, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/650,223

(22) Filed: Jul. 14, 2017

(65) Prior Publication Data

US 2019/0021164 A1 Jan. 17, 2019

(51) Int. Cl.
*H05K 1/02* (2006.01)
*H05K 9/00* (2006.01)
*H01L 23/552* (2006.01)

(52) U.S. Cl.
CPC ......... *H05K 1/0218* (2013.01); *H01L 23/552* (2013.01); *H05K 1/0245* (2013.01); *H05K 9/0039* (2013.01); *H01L 2924/3025* (2013.01); *H01L 2924/30101* (2013.01); *H05K 1/0234* (2013.01); *H05K 1/0236* (2013.01); *H05K 2201/0969* (2013.01)

(58) Field of Classification Search
CPC .. H05K 1/0218; H05K 9/0039; H05K 1/0245; H05K 1/0225; H05K 1/0298; H05K 1/115; H01L 2924/30101; H01L 2924/3025

USPC .......................................................... 333/12
See application file for complete search history.

(56) References Cited

U.S. PATENT DOCUMENTS 6,125,044 A  9/2000 Cherniski et al.
7,327,208 B2 9/2008 Shi et al.
(Continued)

FOREIGN PATENT DOCUMENTS

WO  2017056097 A1  4/2017

OTHER PUBLICATIONS

Hamza, N. et al., "Rejection of Common-Mode Voltages in ECG Signal by Removing the Ground Electrode," (Research Paper), Feb. 2006, 4 pages, http://www.ijser.org/researchpa.
(Continued)

*Primary Examiner* — Robert J Pascal
*Assistant Examiner* — Kimberly E Glenn
(74) *Attorney, Agent, or Firm* — Hewlett Packard Enterprise Patent Department

(57) ABSTRACT

A multiple-layer circuit board has a signaling layer, an exterior layer, and a ground layer. A pair of differential signal lines implemented as strip lines are within the signaling layer, and propagate electromagnetic interference (EMI) along the signaling layer. An element conductively extends inwards from the exterior layer. A void of a defected ground structure within the ground layer has a size, shape, and a location in relation to the element to suppress the EMI propagated by the strip lines. A resistive material of the defected ground structure along a perimeter of the void improves suppression of the EMI propagated by the strip lines, via the resistive material absorbing the EMI.

20 Claims, 3 Drawing Sheets

(56) References Cited

U.S. PATENT DOCUMENTS

| | | | |
|---|---|---|---|
| 8,283,991 B1 | 10/2012 | Essenwanger | |
| 8,508,311 B2 * | 8/2013 | Wu | H04B 3/14 |
| | | | 333/28 R |
| 8,522,811 B2 * | 9/2013 | Yang | F16T 1/26 |
| | | | 137/192 |
| 8,847,705 B2 | 9/2014 | Kameya | |
| 9,118,516 B1 | 8/2015 | Ao et al. | |
| 9,859,603 B2 * | 1/2018 | Kashiwakura | H01P 3/026 |
| 2014/0266850 A1 | 9/2014 | Suorsa | |
| 2015/0229288 A1 | 8/2015 | Kisner et al. | |
| 2015/0359084 A1 | 12/2015 | Kashiwakura | |
| 2017/0092417 A1 | 3/2017 | Kameya | |
| 2017/0318665 A1 * | 11/2017 | Bois | H05K 1/0245 |

OTHER PUBLICATIONS

Weng, L.H. et al., "An Overview on Defected Ground Structure", Progress in Electromagnetics Research B, vol. 7, 2008, pp. 173-189.
Breed, Gary, "An Introduction to Defected Ground Structures in Microstrip Circuits", High Frequency Electronics, Nov. 2008, 3 pp.
Liu, Wie-Tzong. et al.; "An Embedded Common-mode Suppression Filter for Ghz Differential Signals Using Periodic Defected Ground Plane"; IEEE Microwave and Wireless Components Letters, vol. 18, No. 4; Apr. 2008; 3 pp.

* cited by examiner

DEFECTED GROUND STRUCTURE WITH VOID HAVING RESISTIVE MATERIAL ALONG PERIMETER TO IMPROVE EMI SUPPRESSION

BACKGROUND

Electronic devices commonly include circuit boards, such as printed circuit boards. The circuit boards have electrical components like integrated circuits (ICs), capacitors, resistors, and so on attached thereto which interact with one another to provide the desired functionality of the electronic devices. Signal lines are employed on or within the circuit boards to communicatively connect these electrical components.

DETAILED DESCRIPTION

Figure 1A:
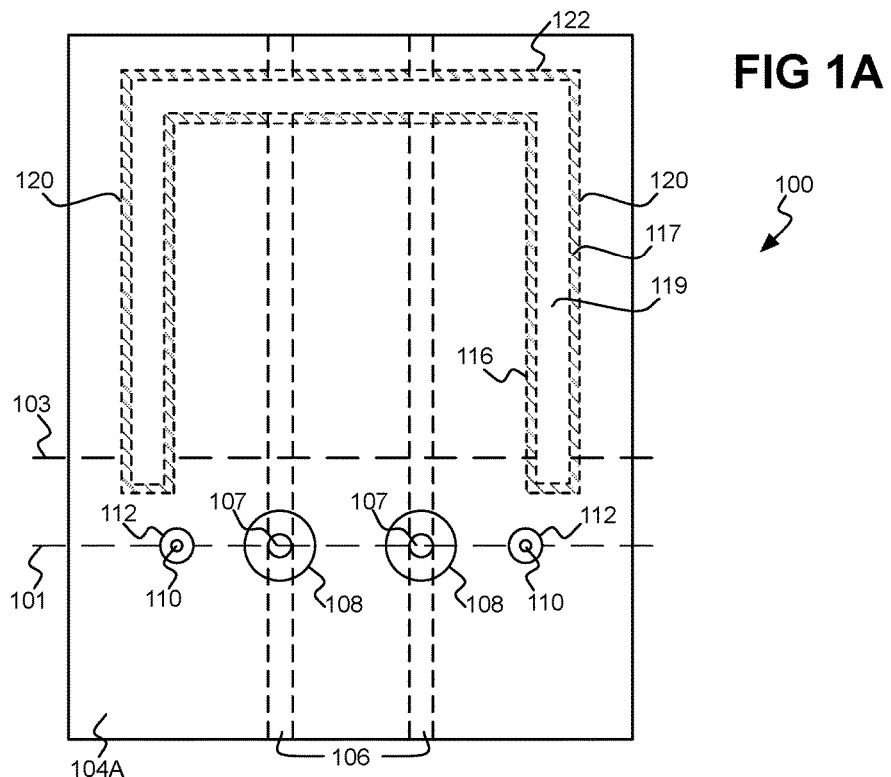
FIGS. 1A, 1B, and 1C are diagrams of a top view and two cross-sectional front views, respectively, of an example circuit board having a defected ground structure to minimize radiation of electromagnetic interference (EMI).

As noted in the background, signal lines are used on or within a circuit board to conductively connect electrical components affixed to the circuit board so that an electronic device including the circuit board can provide a desired functionality. Particularly for high-frequency communication over signal lines, differential signaling can be employed. Differential signaling transmits information using two complementary signals over a pair of differential signal lines. Information is transmitted as the electrical difference between the two signals, as opposed to the difference between a signal on a single signal line and ground, as is done with single-ended signaling. Unlike single-ended signaling, differential signaling is more resistant to common mode noise, or electromagnetic interface (EMI), which commonly affects both signals.

However, differential signal lines still propagate the EMI; indeed, differential signal lines act as highly efficient radiator, such as an antenna, of such EMI. Such radiated EMI can affect other parts of an electronic device, even if the differential signaling achieved over the signal lines themselves is resistant to this EMI. Numerous techniques have been employed to shield other parts of an electronic device from such EMI conveyed by differential signal lines. For example, fabricating the differential signal lines as strip lines within an inner signaling layer of a circuit board, as opposed to as a microstrip on an exterior layer of the board, can contain the EMI within the board itself, suppressing the radiation of the EMI to great extent.

However, an inner signaling layer is still at places conductively exposed at locations at the exterior layer of a circuit board, to communicatively connect discrete electrical components attached to the circuit board at the exterior layer to the differential signal lines. For example, plated vias may extend from the exterior layer to the inner signaling layer to permit bypass capacitors, integrated circuits (ICs), and other components to conductively connect to the signaling layer. Such plated vias and other elements themselves are effectively antennas that radiate outwards from the circuit board the EMI propagated along the signaling layer within the circuit board. Even ground vias that extend from the exterior layer to an inner ground plane or layer of the circuit board can become effective antennas that radiate the EMI contained within the circuit board at the signaling layer. The EMI propagating up to the exterior layer thereafter would radiate from the exterior layer.

Existing solutions to contain the EMI within the signaling layer of a circuit board so as not to permit the EMI to radiate outwards from such elements like plated vias and ground vias have decided shortcomings. Discrete EMI chokes, for instance, only function at low frequencies, and therefore are not suitable for modern high-frequency communications. Mechanical shielding that includes placing metal covers over the elements that act as radiating antennas reduces air flow and thus impinges the ability of an electronic device to operate without overheating. Including absorbing materials within an electronic device, akin to providing an anechoic chamber for the electronic device, similarly can affect the ability to operate the electronic device coolly and increases cost of production.

In the previously filed patent application entitled "defected ground structure to minimize EMI radiation," filed on Apr. 28, 2016, and assigned patent application Ser. No. 15/141,131, techniques are described to contain EMI within a circuit board at the signaling layer without incurring these shortcomings. A defected ground structure, which is also referred to as a defective ground structure, is fabricated within the ground layer of the circuit board. The defected ground layer includes a void having a size, shape, and location in relation to a via or other EMI-radiating antenna element to suppress the EMI propagated by strip lines along and within the signaling layer. By suppressing the EMI that the strip lines propagate near the location of such an element, the defected ground layer effectively minimizes the EMI that the element radiates outwards at the external layer of the circuit board. In other words, the EMI is effectively contained within the signaling layer of the circuit board, reducing the EMI that the antenna element emits outwards from the board.

The defected ground structure of the aforementioned patent application may suppress the EMI that the strip lines propagate near the element and minimize the EMI that the element radiates outwards by reflecting the EMI back towards its source, such as an integrated circuit like a central processing unit (CPU). If suitable measures are not taken at the source of the EMI, then the EMI may nevertheless escape at the source, rather than at the element. Depending on the location of the source of the EMI, the escape of the EMI at the source may as undesired as it is at the element.

Techniques described herein, by comparison, also provide for absorption of the EMI at the defected ground structure, as opposed to just reflecting the EMI back to its source. Therefore, the amount of the EMI that the defected ground structure reflects back to the source is minimized. As such, even if the EMI escapes at the source, the amount that does is lessened via the techniques described herein.

Specifically, a resistive material is novelly added along a perimeter of the void of a defected ground structure. The inventors have discovered that adding such a resistive material along the perimeter of the defected ground structure's void improves suppression of the EMI propagated by the strip lines, and further minimizes the EMI that the element radiates outwards from the circuit board. The inventors have novelly determined that such resistive material along the perimeter of the void absorbs the EMI, so that the void does not just reflect the EMI back to its source, and in this way, the resistive material technologically improves the resulting defected ground structure.

Figure 1B:
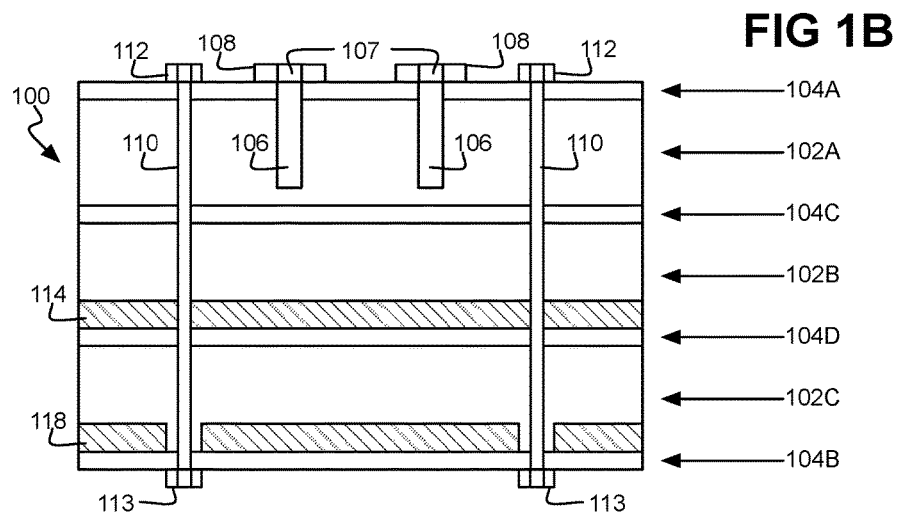
Figure 1C:
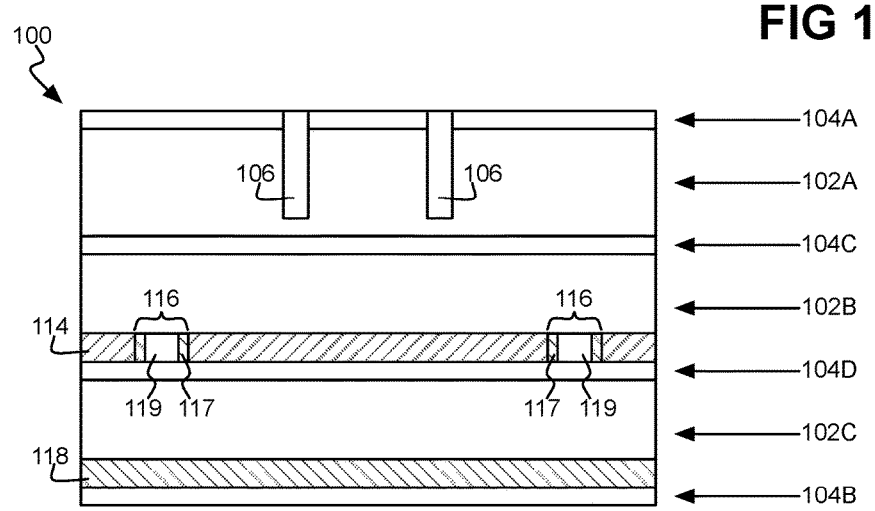

FIGS. 1A, 1B, 1C show a top view and two cross-sectional front views, respectively, of an example multiple-layer circuit board 100, such as a printed circuit board. The cross-sectional front view of FIG. 1B is at the cross-sectional line 101 of FIG. 1A. The cross-sectional front view of FIG. 1C is at the cross-sectional line 103 of FIG. 1A. The circuit board 100 can include layers 102A, 102B, 102C, collectively referred to as the layers 102, as well as layers 104A, 104B, 104C, and 104D, collectively referred to as the layers 104. The layers 102 and the layers 104 are interleaved with one another. There may be more or fewer of the layers 102 and/or 104 than is depicted in the example of FIGS. 1B and 1C.

The layers 102 may be prepreg layers, which are fiber weave layers impregnated with a resin bonding agent. The layers 104 may be core layers, including a top exterior layer 104A, a bottom exterior layer 104B, and middle layers 104C and 104D, such as glass-reinforced epoxy laminate layers of a grade such as FR4. The layers 102 effectively stick the layers 104 together. Conductive traces, such as copper traces, are formed on the layers 104, and extend into the layers 102. For instance, a conductive ground plane 114 may be disposed on the layer 104D, extending into the layer 102B. The ground plane 114 may also be referred to as a ground layer, which provides an electrical ground throughout the circuit board 100. As another example, a power plane 118 may be disposed on the layer 104B, extending into the layer 102C. The conductive power plane 118 may also be referred to as a power layer, which provides electrical power throughout the circuit board 100.

A pair of differential signal lines 106 is located within the layer 102A, which may thus be referred to as a signaling layer. Because the differential signal lines 106 are located within the circuit board 100 and not on the top of the top exterior layer 104A or on the bottom of the bottom exterior layer 104B, the signal lines 106 are strip lines as opposed to a microstrip. The signal lines 106 are depicted in FIGS. 1B and 1C as partially extending through the circuit board 100, but in another implementation they can extend completely through the board 100. Connection vias 107, which may be plated, extend from the signal lines 106 within the layer 102A through the top exterior layer 104A to landing pads 108 to which an external electrical component, such as a decoupling capacitor or an IC like an application-specific IC (ASIC), can be connected.

Similarly, ground return vias 110, which may be plated, extend through the layers 102 and 104 and conductively connect to the ground plane 114 to expose the ground plane 114 on the top of the top exterior layer 104A at landing pads 112 and on the bottom of the bottom exterior layer 104B at landing pads 113. A trace to a common ground can be connected to any of the landing pads 112 and 113 to conductively tie the ground plane 114 to the common ground. The ground plane 114 can extend two dimensionally through the circuit board 100, except at a defected ground structure 116.

The defected ground structure 116 includes a void 119 defined within the ground plane 114 at which there is no conductive material. The defected ground structure 116, in other words, is an etched configuration within the conductive material of the ground plane 114. In the example of FIG. 1A, the defected ground structure 116 has a square bracket shape, having two edges 120 opposite and parallel to one another, and joined at corresponding ends via a third edge 122. The edges 120 are depicted in FIG. 1A as being equal in length, and longer than the length of the third edge 122. The distance between the edges 120 is greater than the distance between the ground return vias 110, and further is greater than the distance between the connection vias 107.

In operation, the differential signal lines 106 propagate EMI along the layer 102A, even if the differential signal transmitted by the signal lines 106 is unaffected by such EMI when the EMI is common mode noise. Because the differential signal lines 106 are strip lines (i.e., the layer 102A is not the exterior layer 104A or 104B of the circuit board 100, and the lines 106 are not formed on the top of the exterior layer 104A or on the bottom of the exterior layer 104B), the EMI is largely contained within the circuit board 100. However, because the vias 107 and 110, which are more generally referred to as elements, extend inwards into the circuit board 100 from the exterior layer 104A and/or 104B, the EMI can radiate outwards from the board 100 at these elements. That is, the elements are effectively antennas that radiate the EMI propagated by the signal lines 106 (i.e., the strip lines) along the signaling layer 102A outwards from the circuit board 100 at the exterior layer 104A and/or 104B.

The defected ground structure 116 (i.e., the void 119 thereof) within the ground plane 114, however, has a size, shape, and location in relation to one or more of the vias 107 and 110 to suppress the EMI propagated by the signal lines 106 to minimize the EMI that these elements radiate outwards as antennas, such as at a selected or desired resonant frequency. The defected ground structure 116 is a non-periodic such structure, because it does not have a repeating shape. Since the radiation of the EMI by the signal lines 106 themselves is inhibited due to the fact that, as strip lines, the signaling lines 106 are located within the circuit board 100, periodicity of the shape can be unnecessary. Furthermore, the square bracket shape of the defected ground structure 116 is relatively simple, and complex shapes that can be difficult to fabricate may be unnecessary, as compared to for defected ground structures used to improve common mode noise resistance of differential signal lines themselves.

The example defected ground structure 116 (i.e., the void 119 thereof) has a size, shape, and location in relation to the vias 107 and 110 that has been shown to suppress the EMI propagated by the differential signal lines 106 to minimize the EMI that these elements radiate outwards as antennas, such as specifically at a resonant frequency of 9.2 gigahertz (GHz). The size of the defected ground structure 116 includes the length and width of the edges 120 and 122 relative to, for instance, the width of each signal (i.e., strip) line 106 and/or the diameter of each of the vias 107 and 110. The shape of the defected ground structure 116 is, as noted above, a square bracket shape. The location of the defected ground structure 116 is its position relative to the vias 107 and 110, such as that of the ends of the edges 120 closest to the vias 107 and 110 in relation to the locations of the vias 107 and 110 themselves, and/or that of the edge 122 in relation to the locations of the vias 107 and 110.

In general, then, a defected ground structure 116 (i.e., a void 119 thereof) is designed to have a size, shape, and location in relation to elements like the vias 107 and 110 that are effective antennas to suppress the EMI propagated by the differential signal lines 106 to minimize the EMI that these effective antennas radiate outwards, at a desired or selected resonant frequency. Determining the size, shape, and location of the defected ground structure 116 for a particular circuit board 100 to minimize radiation of EMI at a given resonant frequency can be achieved by, for instance, determining the total length of the defected ground structure 116, where the sum of both parallel edges 120 and the edge 122 have about one half of a wavelength within the material of the circuit board 100. The resulting defected ground structure 116 can then be tuned by changing the width of the edge 122, and moving the structure 116 with respective to the vias 110. Such optimization can be achieved via simulating is an appropriate three-dimensional (3D) electromagnetic solver tool, or by prototyping and testing.

The defected ground structure 116 also includes a resistive material 117 along a perimeter of the void 119, effectively partially filling in the void 119 beginning at its edges 120 and 122 inwards. The resistive material 117 may be barium titanate, nickel chrome, or another type of resistive material. The resistive material 117 may be as maximally thick as can be fabricated while still preserving a portion of the void 119 in which there is no resistive material 117. The resistive material 117 is relatively thin in FIGS. 1A and 1C for illustrative clarity and convenience, however.

The presence of the resistive material 117 along the perimeter of the void 119 within the defected ground structure 116 further decreases the EMI that radiates outwards from the circuit board 100 at the vias 107 and 110. That is, the resistive material 117 improves the reduction of this radiated EMI. As such, the presence of the resistive material 117 further improves suppression of the EMI propagated by the differential signal lines 106. The void 119 itself reflects the EMI propagated by the differential lines 106 back towards the source of the EMI, which may be an IC or another electronic element disposed on the circuit board 100 or another circuit board conductively connected to the board 100. By comparison, the resistive material 117 absorbs this EMI, decreasing the amount thereof reflected back towards the source of the EMI. In this way, the resistive material 117 improves the defected ground structure 116.

The circuit board 100 is depicted in FIGS. 1B and 1C as including one ground plane 114 having a defected ground structure 116. In another implementation, there can be multiple ground planes, such as two ground planes with one plane located adjacently below the layer at which the signal lines 106 end within the circuit board 100 and another plane located adjacently above the layer at which the signal lines 106 end within the board 100. Each such ground plane can have the same defected ground structure. Such an implementation can result in improved EMI suppression.

Figure 2:
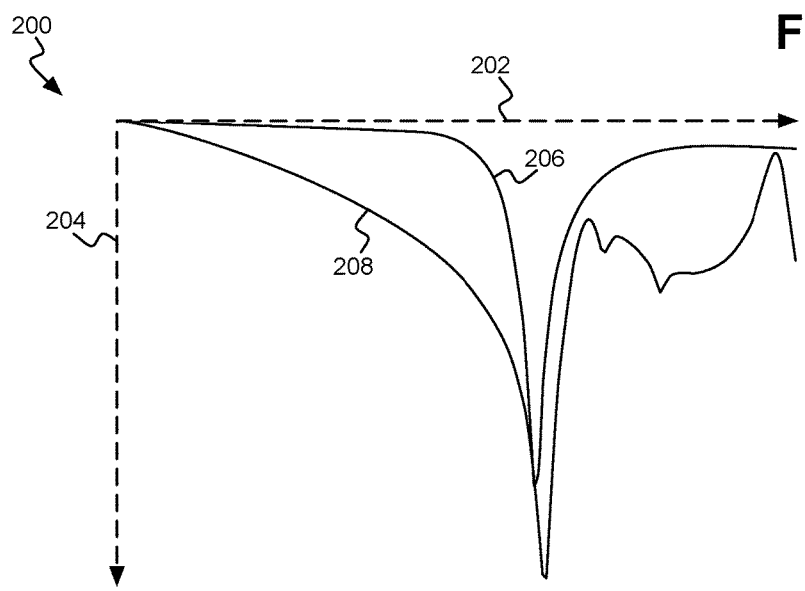
FIG. 2 is a graph of example EMI radiation reduction that a defected ground structure can provide.

FIG. 2 shows a graph 200 of example EMI radiation reduction that the defected ground structure 116 can provide. The graph 200 includes an x-axis denoting frequency, such as in gigahertz (GHz), and a y-axis denoting common mode insertion loss, such as in decibels (dB), within a signal propagated over the signal lines 106. The graph 200 includes a plot 206 corresponding to common mode insertion loss provided by the defected ground structure 116 without the resistive material 117 along the perimeter of the void 119. The graph 200 includes a plot 208 corresponding to corresponding to common mode insertion loss provided by the defected ground structure 116 having the resistive material 117 along the perimeter of the void 119, as explicitly depicted in FIGS. 1A and 1C, for instance.

The lowest point of each plot 206 and 208 corresponds to the selected resonant frequency of the corresponding defected ground structure 116. Stated another way, the respective defected ground structure 116 (i.e., the void 119 thereof) for each plot 206 and 208 has primarily a size and a shape, and to a lesser extent a location relative to the vias 107 and 110, to minimize common mode insertion loss of the signal propagated over the signal lines 106 at the frequency corresponding to the lowest point of the plot in question in FIG. 2. FIG. 2 thus shows that adding the resistive material 117 along the perimeter of the void 119 within the defected ground structure 116 further minimizes common mode insertion loss, since the lowest point of the plot 208 is lower than the lowest point of the plot 206.

The resonant frequency of the defected ground structure 116 can be selected to correspond to the frequency of the signal that the signal lines 116 propagate, to minimize EMI at this frequency. Furthermore, adding the resistive material 117 along the perimeter of the void 119 within the defected ground structure 116 widens the frequency band around the selected frequency of the structure 116. FIG. 2 evidences this because at frequencies higher and lower than the selected frequency, the plot 208 is at a lower level than the plot 206 is.

The size, shape, and location of the defected ground structure 116 (i.e., the void 119 thereof) relative to the vias 107 and 110 thus result in the defected ground structure 116 (i.e., the void 119 thereof) to function as a notch filter at a selected resonant frequency. The presence of the resistive material 117 along the perimeter of the void 119 widens the frequency band of this notch filter. Therefore, the notch filter rejects EMI over a wider frequency band, as well as rejecting more EMI at the selected resonant frequency, when the defected ground structure 116 includes the resistive material 117 along the perimeter of the void 119.

Figure 3:
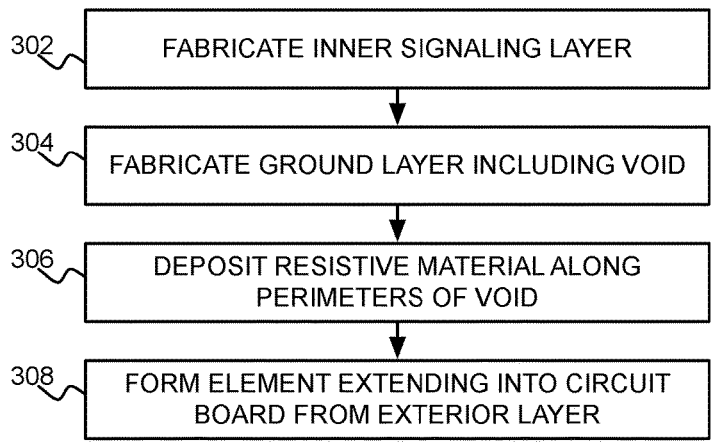
FIGS. 3 and 4 are flowcharts of example methods for fabricating a circuit board having a defected ground structure to reduce EMI emitted outwards from the circuit board.

FIG. 3 shows an example method 300 including constituent circuit board fabrication steps, parts, or acts. Fabrication of a circuit board 100 includes fabricating an inner signaling layer, such as the layer 102A, so that it includes a pair of differential signal lines 106 that convey EMI along the layer (302). Fabrication further includes fabricating a ground layer, such as the ground plane 114, that includes a void 119 and thus a defected ground structure 116 (304), as well as depositing resistive material 117 along the perimeters of the void 119. The ground layer may be fabricated by depositing a metal layer as the ground plane 114, and the void 119 formed therein by etching, for instance. Furthermore, deposition of the resistive material 117 may be achieved by sputtering or via another thin film application technique.

Fabrication of the circuit board 100 includes forming an element, such as one or more of the vias 107 and 110, which extends into the circuit board from an exterior layer 104A and/or 104B (306). The element emits the EMI conveyed along the inner signaling layer outwards from the circuit board 100. The defected ground structure 116 (i.e., the void 119 thereof) has a size, shape, and location relative to the element to contain the EMI within the circuit board 100 to reduce the EMI that the element emits outwards from the board 100. The presence of the resistive material 117 improves containment of the EMI within the circuit board 100 to further reduce the EMI that the element emits outwards from the board 100.

Figure 4:
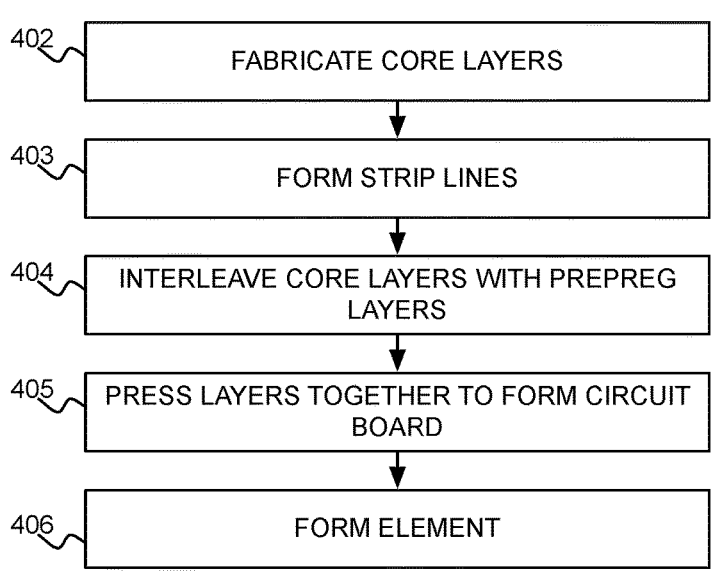

FIG. 4 shows another example method 400 for fabricating the circuit board 100. The method 400 includes fabricating core layers 104 (402). For example, the ground plane 114 may be fabricated on the core layer 104D by depositing a conductive material thereon, then patterning and removing the conductive material selectively to form the void 119 of the defected ground structure 116, and finally depositing the resistive material 117 along the perimeter of the void 119. The power plane 118 may similarly be fabricated on the core layer 104B by depositing and then selectively patterning and removing conductive material. The method 400 includes forming strip lines, such as the differential signal layers 106, within a prepreg layer 102A (403). For example, the prepreg layer 102A may have two parallel rows of material removed therefrom, and then filled with a conductive material via deposition, which results in the differential signal layers 106.

The method 400 includes interleaving the core layers 104 with the prepreg layers 102 (403), such as in the order depicted in FIG. 1B, and pressing the resulting stack of layers 102 and 104 together under pressure to form the circuit board 100 (404). An element, such as one or more of the vias 107 and 110, can then be formed within the circuit board 100 (306). For example, holes of the appropriate diameter and depth may be bored or otherwise formed to an appropriate depth through the layers 102 and 104 of the circuit board 100. The resulting vias can be filled or plated with a conductive material.

Figure 5:
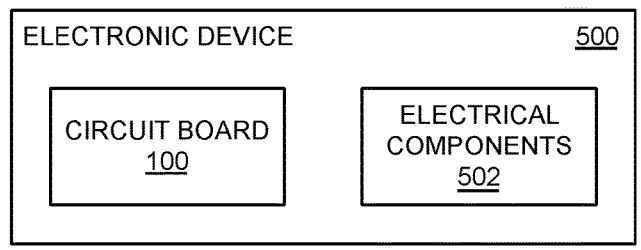
FIG. 5 is a diagram of an example apparatus, such as an electronic device, which includes a circuit board having a defected ground structure to reduce or minimize EMI radiation or emission from the circuit board.

FIG. 5 shows an example electronic device 500, which is more generally an apparatus. The electronic device 500 includes the circuit board 100 that has been described, including the defected ground structure 116 having the void 119 and the resistive material 117 along the perimeter of the void 119, for instance, to reduce if not eliminate EMI emissions at a selected resonant frequency from elements like the vias 107 and 110. The electronic device 500 may further include electrical components 502 that are mounted or attached to the circuit board 100, such as at landing pads 108 and 112 surrounding the vias 107 and 110, respectively. Examples of such components 502 include capacitors such as decoupling capacitors, ICs such as ASICs, as well as other types of electrical components. One or more of the electrical components 502 may be the source of the EMI.

The techniques disclosed herein thus minimize radiation of EMI at a selected resonant frequency from vias and other effective antennas that otherwise emit EMI which propagates along differential strip lines within a circuit board. These techniques include suppressing the EMI at the strip lines at locations near the effective antennas. Therefore, the amount of EMI that reaches the antennas is reduced, such that EMI radiation from the circuit board is reduced. EMI suppression in this respect is achieved by using a defected ground structure designed to include a void having a size, shape, and location for this purpose, as opposed to, for instance, improve common mode noise rejection of the strip lines themselves. Furthermore, the defected ground structure includes a resistive material along a perimeter of the void to further reduce and suppress the EMI radiation.

We claim:

1. An apparatus comprising:
a multiple-layer circuit board having a signaling layer, an exterior layer, and a ground layer;
a pair of differential signal lines implemented as strip lines within the signaling layer, which propagate electromagnetic interference (EMI) along the signaling layer;
an element conductively extending inwards from the exterior layer; and
a defected ground structure comprising:
a void within the ground layer and having a size, shape, and location in relation to the element to suppress the EMI propagated by the strip lines; and
a resistive material along a perimeter of the void to improve suppression of the EMI propagated by the strip lines by absorbing the EMI.

2. The apparatus of claim 1, wherein the element, as an antenna, radiates the EMI propagated by the strip lines along the signaling layer outwards from the circuit board, and wherein the defective ground structure is to minimize the EMI that the element radiates outwards as the antenna.

3. The apparatus of claim 1, wherein the resistive material is one of barium titanate and nickel chrome.

4. The apparatus of claim 1, wherein the size, shape, and the location of the void in relation to the element suppress the EMI at a selected resonant frequency,
and wherein the resistive material is to further improve suppression of the EMI at the selected resonant frequency, and is to widen a frequency band around the selected resonant frequency at which the EMI is suppressed.

5. The apparatus of claim 1, wherein the size, shape, and the location of the void in relation to the element cause the void to function as a notch filter for the EMI at a selected resonant frequency,
and wherein the resistive material is to widen a frequency band of the notch filter, and is to increase rejection of the EMI at the selected resonant frequency.

6. The apparatus of claim 1, wherein the defected ground structure is a non-periodic defected ground structure.

7. The apparatus of claim 6, wherein the shape of the defective ground structure is a square bracket shape having a first edge and a second edge parallel to one another, and a third edge perpendicular to the first edge and the second edge and connecting corresponding ends of the first edge and the second edge.

8. The apparatus of claim 7, wherein the first edge and the second edges are of equal length, which is longer than a length of the third edge.

9. The apparatus of claim 7, wherein the corresponding ends of the first edge and the second edge are first corresponding ends, the element is a first element, the apparatus further comprises a second element corresponding to the first element,
and wherein a distance between the first edge and the second edge is greater than a distance between the first element and the second element.

10. The apparatus of claim 1, wherein the element is one of:
a ground return via conductively extending inwards from the exterior layer to the ground layer;
a connection via conductively extending inwards from the exterior layer to the signaling layer.

11. A method comprising:
fabricating an inner signaling layer of a circuit board to include a pair of differential signal lines that convey electromagnetic interference (EMI) along the inner signaling layer;
forming an element conductively extending into the circuit board from an exterior layer of the circuit board, the element emitting the EMI conveyed along the inner signaling layer outwards from the circuit board;
fabricating a ground layer of the circuit board to include a void having a size, shape, and location in relation to the element to contain the EMI within the circuit board to reduce the EMI that the element emits outwards from the circuit board; and
depositing a resistive material along a perimeter of the void to improve containment of the EMI within the circuit board and to improve reduction of the EMI that the element emits outwards from the circuit board by the resistive material absorbing the EMI.

12. The method of claim 11, wherein depositing the resistive material comprises one of:

sputtering the resistive material along the perimeter of the void;

applying a film of the resistive material along the perimeter of the void.

13. The method of claim 11, wherein fabricating the ground layer to include the void comprises fabricating the ground layer to include the void having the size, shape, and the location in relation to the element to contain the EMI at a selected resonant frequency within the circuit board, and wherein deposition of the resistive material along the perimeter of the void is to further improve containment of the EMI at the selected resonant frequency, and is to widen a frequency band around the selected resonant frequency at which the EMI is contained.

14. The method of claim 11, wherein fabricating the ground layer to include the void comprises fabricating the ground layer to include the void having the size, shape, and the location in relation to the element to cause the void to function as a notch filter for the EMI at a selected resonant frequency, and wherein deposition of the resistive material along the perimeter of the void is to further widen a frequency band of the notch filter, and is to increase rejection of the EMI at the selected resonant frequency.

15. The method of claim 11, wherein fabricating the ground layer comprises fabricating the ground layer to include a non-periodic defected ground structure.

16. The method of claim 11, wherein forming the element comprises forming a via conductively extending inwards from the exterior layer to one of the ground layer and the signaling layer.

17. A circuit board comprising:
a signaling layer including a pair of strip lines that propagate electromagnetic interference (EMI);

an exterior layer from which an effective antenna extends inwards towards the signaling layer, the effective antenna radiating the EMI propagated by the strip lines outwards from the circuit board;

a ground plane having a void that has a size, shape, and location relative to the effective antenna to suppress the EMI propagated by the strip lines to reduce the EMI that the effective antenna radiates outwards; and a resistive material along a perimeter of the void to improve suppression of the EMI propagated by the strip lines and to improve reduction of the EMI that the effective antenna radiates outwards via absorption of the EMI.

18. The circuit board of claim 17, wherein the size, shape, and the location of the ground plane in relation to the element suppress the EMI at a selected resonant frequency, and wherein the resistive material is to further improve suppression of the EMI at the selected resonant frequency, and is to widen a frequency band around the selected resonant frequency at which the EMI is suppressed.

19. The circuit board of claim 17, wherein the size, shape, and the location of the void in relation to the element cause the void to function as a notch filter for the EMI at a selected resonant frequency, and wherein the resistive material is to widen a frequency band of the notch filter, and is to increase rejection of the EMI at the selected resonant frequency.

20. The circuit board of claim 17, wherein the effective antenna is one or more of a connection via connectable to an electrical component, and a ground return via.

* * * * *